United States Patent [19]

Gündel et al.

[11] 4,447,806
[45] May 8, 1984

[54] TEST CIRCUIT FOR ELECTRICAL CONTINUITY OF A LOAD CIRCUIT

[75] Inventors: Manfred Gündel; Heinz-Werner Schlamm; Klaus-Dieter Schmitz, all of Wuppertal, Fed. Rep. of Germany

[73] Assignee: Kabelwerke Reinshagen GmbH, Fed. Rep. of Germany

[21] Appl. No.: 330,065

[22] Filed: Dec. 14, 1981

Related U.S. Application Data

[63] Continuation of Ser. No. 317,739, Nov. 3, 1981.

[30] Foreign Application Priority Data

Nov. 3, 1980 [DE] Fed. Rep. of Germany ....... 3041206

[51] Int. Cl.³ .......................................... G08B 21/00
[52] U.S. Cl. .................................. 340/641; 340/643; 340/80
[58] Field of Search ................ 340/74, 84, 638, 641, 340/642, 643, 652, 80, 71; 315/129, 133, 136, 82, 83

[56] References Cited

U.S. PATENT DOCUMENTS

| | | | |
|---|---|---|---|
| 3,643,247 | 2/1972 | Ratcliffe | 340/642 |
| 3,644,886 | 2/1972 | Sabaroff | 340/643 |
| 3,995,262 | 11/1976 | France et al. | 340/643 |
| 4,222,047 | 9/1980 | Finnegan | 340/641 |
| 4,401,972 | 8/1983 | Lupoli | 340/641 |

FOREIGN PATENT DOCUMENTS

| | | | |
|---|---|---|---|
| 2700995 | 7/1978 | Fed. Rep. of Germany | 340/643 |
| 2032155 | 4/1980 | United Kingdom | 340/643 |

Primary Examiner—Gerald L. Brigance
Attorney, Agent, or Firm—Reising, Ethington, Barnard, Perry & Milton

[57] ABSTRACT

A test circuit is disclosed for testing the continuity of a load circuit, such as a vehicle lamp circuit, and indicating a discontinuity when the load circuit is either energized or de-energized. The test circuit comprises an indicating circuit with an LED and a switching transistor in series and a voltage divider for biasing the transistor to a conductive state. The detecting circuit includes a reed switch which is closed in response to load current for connecting a point on the voltage divider to ground to switch the transistor off. The detecting circuit also includes current blocking means such as a diode for connecting the voltage divider to ground through the load circuit so that the transistor is switched off when there is continuity in the load circuit to ground.

7 Claims, 2 Drawing Figures

TEST CIRCUIT FOR ELECTRICAL CONTINUITY OF A LOAD CIRCUIT

This is a continuation of Ser. No. 317,739 filed on Nov. 3, 1981 and entitled "TEST CIRCUIT FOR ELECTRICAL CONTINUITY OF A LOAD CIRCUIT".

FIELD OF THE INVENTION

This inventio relates to test circuits and more particularly, test circuits for testing electrical continuity of an electrical load circuit. The test circuit is especially adapted for indicating an open circuit or discontinuity in an electrical load, such as a lamp outage in a vehicle lamp circuit.

BACKGROUND ART

Test circuits are known in which a series resistor is connected in a load circuit and the voltage drop across the resistor serves as a measure for checking the continuity of the load circuit. See published German patent application DE-OS No. 2,147,681. Such a voltage drop is generally undesirable in the circuit. If the voltage drop is kept at a low value by use of a low resistance, the detection circuit for sensing the voltage drop to indicate continuity is of increased complexity. Further, testing of the load circuit continuity is possible only with the load circuit switch on in order to produce the voltage drop. This is sometimes referred to as hot interrogation or hot testing. If the load circuit is switched off, a discontinuity in the load circuit is not detectable with such a hot test circuit.

In the published German patent application DE-AS No. 2,363,091 it is proposed to test the continuity of the load circuit before the load circuit is turned on. This sometimes is referred to as cold interrogation or cold testing. In this prior art, a special circuit arrangement is adapted to detect the defective stop light of a vehicle before the brake is applied to energize the brake light. However, this circuit arrangement is applicable only to two loads connected in parallel, as is the case with stop lights of a vehicle. This circuit only indicates failures which exist before the first brake actuation.

In the published German patent application DE-OS No. 2,906,878, a reed switch is disclosed for controlling a pilot lamp. With this circuit arrangement only hot testing is possible.

SUMMARY OF THE INVENTION

According to this invention, a load circuit is tested for discontinuity in both the switched on state and the switched off state and an indication is produced in the event of discontinuity in either state.

According to this invention, a test circuit comprises an indicating circuit connected across the terminals of a voltage source and including an indicating device and a first switching means. The detecting circuit includes a second switching means. The input member of the first switching means is coupled through the second switching means to one terminal of the voltage source and is coupled through a current blocking means and the load device to said one terminal of the voltage source. The input member of the second switching means is coupled with the load circuit and is operative to change the second switching means between one and the other conductive and nonconductive states in response to current in the load circuit. The indicating device is in the normal state when there is continuity of the load circuit with the load switch either turned off or turned on and it is in the abnormal state when there is a discontinuity of the load circuit with said load switch either turned off or turned on. Preferably, the current blocking means is a diode. The first switching means is a transistor and the second switching means is a reed switch having an inductive winding coupled with the load circuit as the input member. In another embodiment, the second switching means is a reed switch with single pole double throw switch contacts and the current blocking means is a pair of the contacts which are opened to prevent short circuiting of the load device when there is no discontinuity in the load circuit and the load switch is closed. Preferably, the indicating device is a light emitting diode (LED).

BEST MODE FOR CARRYING OUT THE INVENTION

Figure 2:
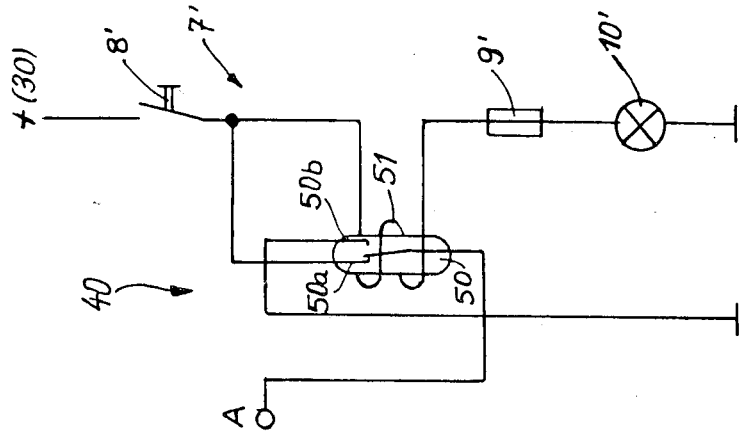
FIG. 2 is a schematic diagram of a modification of the test circuit of this invention.

Referring now to the drawings, there is shown an illustrative embodiment of the invention in a test circuit which is especially adapted for monitoring lighting circuits for automotive vehicles and indicating the occurrence of an open circuit in case of a lamp outage, such as that caused by burnout. The invention is illustrated in a vehicle electrical system of a conventional type having a battery supply with a negative ground. It will be understood, of course, that the invention may be used in different forms of vehicle electrical circuits and may also be used in other applications.

The test circuit includes an indicating stage or circuit 1 which is connected across the vehicle battery voltage source between the positive terminal (15) and ground. Typically, the supply voltage from the vehicle battery is about 13 volts. In the illustrative embodiment, the electrical system has a negative ground. The indicating circuit 1 includes a light emitting diode (LED) 2 which is utilized as the indicating device to indicate to the vehicle operator that a lamp outage has occurred. The indicating circuit also includes a switching means in the form of a transistor 3 which is of the NPN type. The LED 2, a current limiting resistor $R_1$ and the transistor 3 are connected in series, in the order named, between the positive terminal of the voltage source and ground. A voltage divider, which includes series resistors $R_2$, $R_3$ and $R_4$, is connected between the positive terminal of the voltage source and ground. The base of the transistor 3 is connected to the node between resistors $R_3$ and $R_4$. The voltage divider resistors have such values that the voltage produced on the base of the transistor by the circuit thus far described is sufficiently positive to turn on the transistor 3. When transistor 3 is turned on, the LED 2 is thereby turned on. However, it will be apparent from the description that follows that the normal state for the indicating circuit is that in which transistor 3 and LED 2 are turned off. The abnormal state is that in which transistor 3 and LED 2 are turned on. The indicating circuit 1 is coupled with the detecting circuit 4 through a terminal E at the junction of resistors $R_2$ and $R_3$. As indicated, the terminal E is connected with a terminal A on the detecting circuit.

Figure 1:
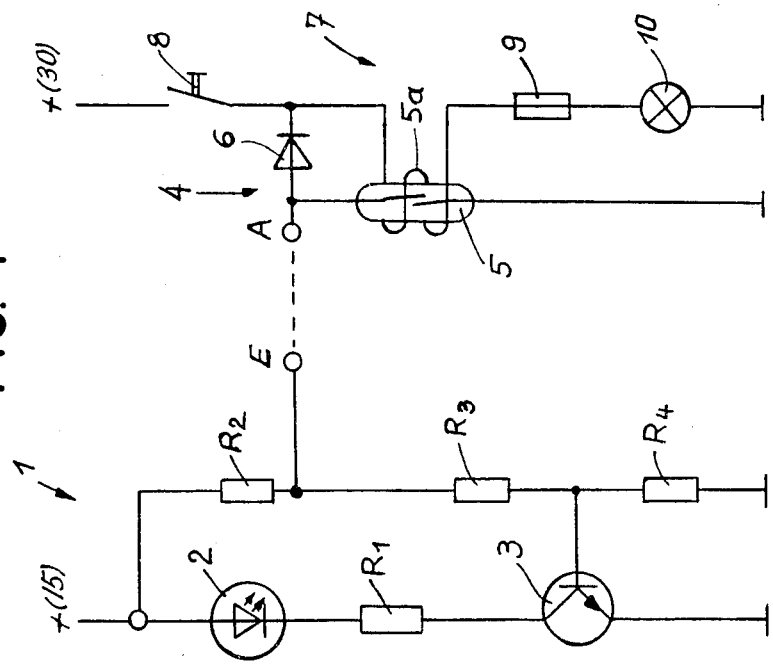
FIG. 1 is a schematic diagram of the test circuit of this invention.

The detecting circuit 4, as shown in FIG. 1, includes a reed switch 5 which is connected between the terminal A and ground. A diode 6 is connected in the forward direction between the terminal A to the load circuit 7. The load circuit 7 is connected between the positive terminal (30) of the battery voltage source and ground. The load circuit includes load switch 8, an inductive winding 5a of the reed switch 5, a fuse 9 and a lamp or light bulb 10, the light bulb being the load device. The diode is connected in the forward conducting direction between the terminal A and the junction between the load switch 8 and the winding 5a.

FIG. 2 shows a different embodiment in that a detecting circuit 40 is used in place of the detecting circuit 4. In the detecting circuit 40, a reed switch 50 includes single pole double throw switch contacts and one pair of the contacts serves the same function as the diode 6 in circuit 4. In particular, the normally closed fixed contact 50a is connected with the junction between the load switch 8' and the inductive winding 51 of the reed switch 50. The movable contact of the reed switch is connected with the terminal A. The fixed contact 50b of the reed switch 50 is connected directly to ground. The load circuit 7' in FIG. 2 comprises the load switch 8', the inductive winding 51 of reed switch 50, a fuse 9' and a light bulb 10', which is the load device.

The operation of the circuit of FIG. 1 is as follows. When the ignition switch of the vehicle is turned on, as in a conventional vehicle electrical system, an operating voltage is connected to the terminal (15). In order to turn on the LED 2 the transistor 3 must be turned on and this requires a sufficient base-emitter voltage to be developed by the voltage divider at the junction of resistors $R_3$ and $R_4$. For the conventional transistor, the voltage required is about 0.7 volts. However, the required base-emitter voltage will not be produced if the terminal E is connected to ground through either the reed switch 5 or the load circuit 7. When there is continuity to ground through the load circuit or through the reed switch, the resistors $R_3$ and $R_4$ of the voltage divider are substantially bypassed. Accordingly, the transistor 3 is turned off.

The operation is further described by the following example cases. For case 1, assume that load switch 8 is open and light bulb 10 is turned off and a cold interrogation is to be made. If there is continuity of the load circuit 7, the terminal E is connected through the diode 6 in the forward direction to ground through the load circuit. The forward voltage of the diode 6 is about the same as the base-emitter break-down voltage of the transistor 3, i.e. about 0.7 volts, and the voltage at the base of transistor 3 will be reduced to a lower value by the voltage divider resistors $R_3$ and $R_4$. This will be insufficient to turn the transistor on. Accordingly, the cold interrogation of continuity in the load circuit will result in holding the LED 2 in the turned off state. If the load circuit is defective and exhibits a discontinuity, there will be no current path through the diode 6 to ground. Accordingly, the voltage at the base of transistor 3 will be sufficient to turn transistor 3 on and the LED will be turned on to indicate a malfunction.

For case 2, it will be assumed that the load switch 8 is closed. The light bulb 10 should be turned on and a hot interrogation is to be made. If there is continuity in the load circuit to ground, the load current flows through the inductive winding 5a and the contacts of the reed switch 5 are closed. This connects the terminal A to ground and the voltage at the base of transistor 3 is insufficient to turn the transistor on. Accordingly, the LED is held in the turned off state corresponding to the absence of a malfunction. If the load circuit 7 is defective, as by an open circuit in light bulb 10, the contacts of the reed switch 5 are open. The load circuit itself has a discontinuity and the terminal A is isolated from ground. As a result, the voltage at the base of the transistor 3 is sufficient to turn the transistor on and, consequently, the LED 2 is in the turned on state to indicate the malfunction.

The operation of the test circuit in the embodiment of FIG. 2 is similar to that described above. For case 1, it is assumed that the load switch 8' is open and the light bulb 10' is turned off and a cold interrogation is to be made. If there is continuity of the load circuit 7', the movable contact of the reed switch 50 is connected with a fixed contact 50a and the terminal A is connected to ground through the load circuit. Accordingly, the voltage at the base of transistor 3 is insufficient to turn the transistor on and the LED 2 is in a turned off state indicating no malfunction. If the load circuit 7' is defective, as by a burnout of the light bulb 10', there will be no current through the load circuit. Accordingly, the terminal A will be isolated from ground and the voltage at the base of transistor 3 will be sufficient to turn the transistor 3 on. As a result, the LED 2 will be turned on indicating a malfunction.

In case 2, for the detecting circuit of FIG. 2, it is assumed that the load switch 8' is closed and a hot interrogation is to be made. If there is continuity of the load circuit 7' the load current will flow through the conductive winding 51 of the reed switch 50 and the movable contact thereof will be closed against the fixed contact 50b. This connects the terminal A to ground and as a result, the LED 2 is in a turned off state indicating no malfunction. If there is a discontinuity in the load circuit 7', as by a burnout of the light bulb 10', the movable contact of the reed switch 50 engages the normally closed contact 50a. Consequently, the terminal A is isolated from ground and the voltage at the base of transistor 3 is sufficient to turn the transistor on which results in the LED 2 being turned on to indicate the malfunction.

Although the description of this invention has been given with reference to a particular embodiment, it is not to be construed in a limiting sense. Many variations and modifications will now occur to those skilled in the art. For a definition of the invention reference is made to the appended claims.

What is claimed is:

1. In a test circuit for testing electrical continuity of an electrical load circuit, said load circuit including a load switch and a load device connected in series in the order named between the first and second terminals of a voltage source, said test circuit being of the type which includes an indicating device having normal and abnormal states, the improvement comprising, an indicating circuit connected across the terminals of said voltage source and including said indicating device and a first switching means, said first switching means having an input member for changing the first switching means between conductive and nonconductive states, a detecting circuit including a second switching means having an input member responsive to current for changing the second switching means between conductive and nonconductive states, the input member of the first switching means being coupled to the second terminal of the voltage source through said second switching means, the input member of the first switching means being coupled to said second terminal of the voltage source through a current blocking means and the load device, the input member of the second switching means being coupled with said load circuit and being operated to change the second switchng means between one and the other of the conductive and nonconductive states in response to current in the load circuit, said indicating device being in a normal state when there is continuity of said load circuit with said load switch turned off or turned on and being in an abnormal state when there is discontinuity of said load circuit with said load switch turned off or turned on.

2. The invention as defined in claim 1 wherein said current blocking means is a diode.

3. The invention as defined in claim 1 or 2 wherein said second switching means is a reed switch and the input member of the second switching means is an inductive winding coupled with said load circuit.

4. The invention as defined in claim 1 wherein said second switching means is a reed relay with single pole double throw switch contacts and said current blocking means is a pair of said contacts which are opened to prevent short circuiting of said load device by said second switching means.

5. The invention as defined in claims 1, 2, or 4 wherein said indicating device is a light emitting diode and said first switching means is a transistor.

6. The invention as defined in claim 5 wherein the emitter and collector of said transistor are connected in series with said light emitting diode, a voltage divider connected in parallel with said light emitting diode and said transistor, said input member of the first switching means being the base of said transistor, said base being connected to said voltage divider, at least a portion of said voltage divider being coupled through the second switching means to the second terminal of the voltage source for short circuiting at least a portion of said voltage divider when said second switching means is conductive and when said load circuit does not have a discontinuity.

7. The invention as defined in claim 3 wherein said indicating device is a light emitting diode and said first switching means is a transistor.

* * * * *